US008002078B2

(12) United States Patent
Chan et al.

(10) Patent No.: US 8,002,078 B2
(45) Date of Patent: Aug. 23, 2011

(54) ACOUSTIC WAVEGUIDE VIBRATION DAMPING

(75) Inventors: Jacky Chi-Hung Chan, Framingham, MA (US); Brian J. Gawronski, Framingham, MA (US)

(73) Assignee: Bose Corporation, Framingham, MA (US)

( * ) Notice: Subject to any disclaimer, the term of this patent is extended or adjusted under 35 U.S.C. 154(b) by 11 days.

(21) Appl. No.: 12/388,723

(22) Filed: Feb. 19, 2009

(65) Prior Publication Data

US 2010/0206661 A1 Aug. 19, 2010

(51) Int. Cl.

*A47B 81/06* (2006.01)
*F16F 7/00* (2006.01)
*G01S 15/00* (2006.01)
*H04R 1/20* (2006.01)
*H05K 5/00* (2006.01)

(52) U.S. Cl. ........ 181/151; 181/145; 181/155; 181/156; 181/199; 181/207; 367/99; 381/337; 381/338; 381/353

(58) Field of Classification Search .................. 181/151, 181/156, 145, 155, 199; 381/338, 337, 353; 367/99

See application file for complete search history.

(56) References Cited

U.S. PATENT DOCUMENTS

| | | | | |
|---|---|---|---|---|
| 4,164,988 | A * | 8/1979 | Virva | 181/156 |
| 4,452,334 | A * | 6/1984 | Rogers | 181/175 |
| 4,628,528 | A * | 12/1986 | Bose et al. | 381/335 |
| 4,837,837 | A * | 6/1989 | Taddeo | 381/346 |
| 4,958,332 | A * | 9/1990 | Tellerman | 367/140 |
| 5,012,890 | A * | 5/1991 | Nagi et al. | 381/96 |
| 5,170,435 | A * | 12/1992 | Rosen et al. | 381/86 |
| 5,261,006 | A * | 11/1993 | Nieuwendijk et al. | 381/353 |
| 5,545,984 | A * | 8/1996 | Gloden et al. | 324/207.13 |
| 5,740,259 | A * | 4/1998 | Dunn | 381/332 |
| 5,804,774 | A * | 9/1998 | Ford et al. | 181/152 |
| 5,815,589 | A * | 9/1998 | Wainwright et al. | 381/346 |
| 6,122,389 | A * | 9/2000 | Grosz | 381/361 |
| 6,278,789 | B1 * | 8/2001 | Potter | 381/338 |
| 6,335,974 | B1 * | 1/2002 | Kunimoto | 381/306 |
| 6,654,472 | B1 * | 11/2003 | Jeon | 381/349 |
| 6,771,787 | B1 * | 8/2004 | Hoefler et al. | 381/338 |
| 7,207,413 | B2 * | 4/2007 | Plummer | 181/199 |
| 7,410,029 | B2 * | 8/2008 | Tanaami | 181/156 |
| 7,565,948 | B2 * | 7/2009 | Parker et al. | 181/148 |
| 7,584,820 | B2 * | 9/2009 | Parker et al. | 181/155 |
| 7,614,479 | B2 * | 11/2009 | Plummer | 181/199 |
| 2002/0015501 | A1 * | 2/2002 | Sapiejewski | 381/71.6 |
| 2004/0182149 | A1 * | 9/2004 | Balin et al. | 73/290 V |

(Continued)

FOREIGN PATENT DOCUMENTS

EP 0429121 A1 5/1991

(Continued)

OTHER PUBLICATIONS

International Search Report and Written Opinion dated Jul. 29, 2010 for Int. Appln. No. PCT/US2010/021592.

*Primary Examiner* — Elvin G Enad
*Assistant Examiner* — Christina Russell

(57) ABSTRACT

An acoustic waveguide with at least two portions coupled by vibration damping structure. The vibration damping structure may be a conformable material such as closed cell foam. The vibration damping structure may further include structure for inhibiting motion in a direction transverse to the interface between the vibration damping structure and a portion of the waveguide.

2 Claims, 4 Drawing Sheets

U.S. PATENT DOCUMENTS

| | | | | |
|---|---|---|---|---|
| 2005/0036642 | A1 * | 2/2005 | Hoefler et al. | 381/338 |
| 2005/0089184 | A1 * | 4/2005 | Wang | 381/345 |
| 2007/0086615 | A1 * | 4/2007 | Cheney | 381/338 |
| 2007/0240504 | A1 * | 10/2007 | Barr et al. | 73/290 R |
| 2007/0246291 | A1 * | 10/2007 | Drake et al. | 181/141 |
| 2008/0152181 | A1 * | 6/2008 | Parker et al. | 381/345 |
| 2008/0211344 | A1 * | 9/2008 | Kando | 310/313 R |
| 2008/0232197 | A1 * | 9/2008 | Kojima et al. | 367/99 |
| 2009/0003639 | A1 * | 1/2009 | Aylward | 381/349 |
| 2009/0016555 | A1 * | 1/2009 | Lynnworth | 381/338 |
| 2009/0025487 | A1 * | 1/2009 | Gysling et al. | 73/861.25 |
| 2009/0084625 | A1 * | 4/2009 | Bastyr et al. | 181/192 |
| 2009/0274329 | A1 * | 11/2009 | Ickler et al. | 381/338 |

FOREIGN PATENT DOCUMENTS

| | | |
|---|---|---|
| EP | 0598391 A2 | 5/1994 |

* cited by examiner

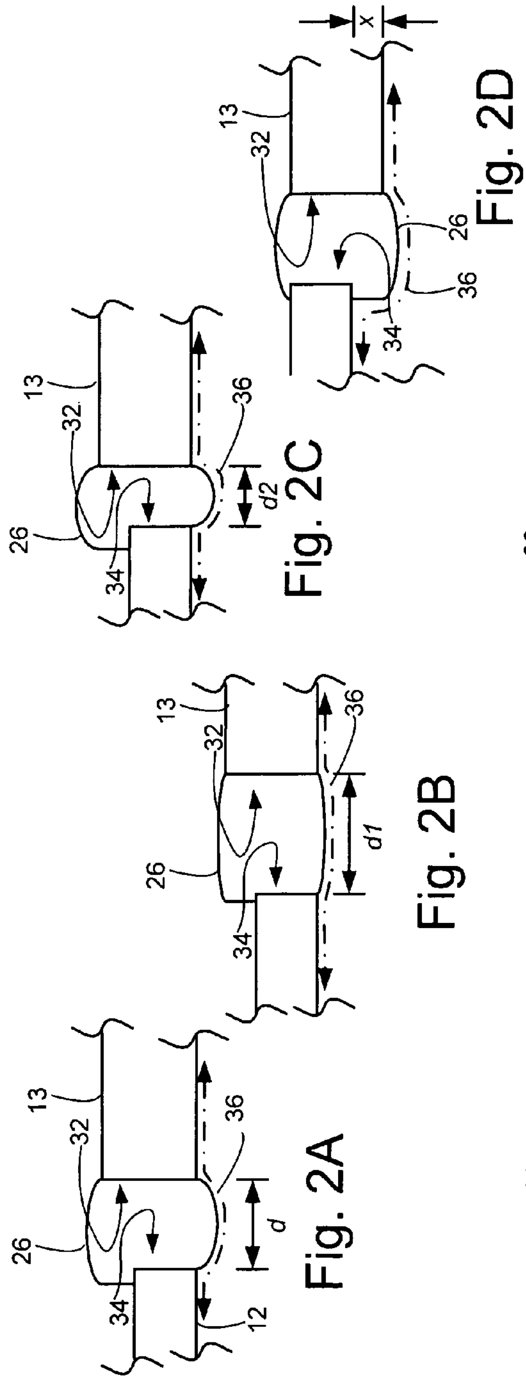
Fig. 2A
Fig. 2B
Fig. 2C
Fig. 2D
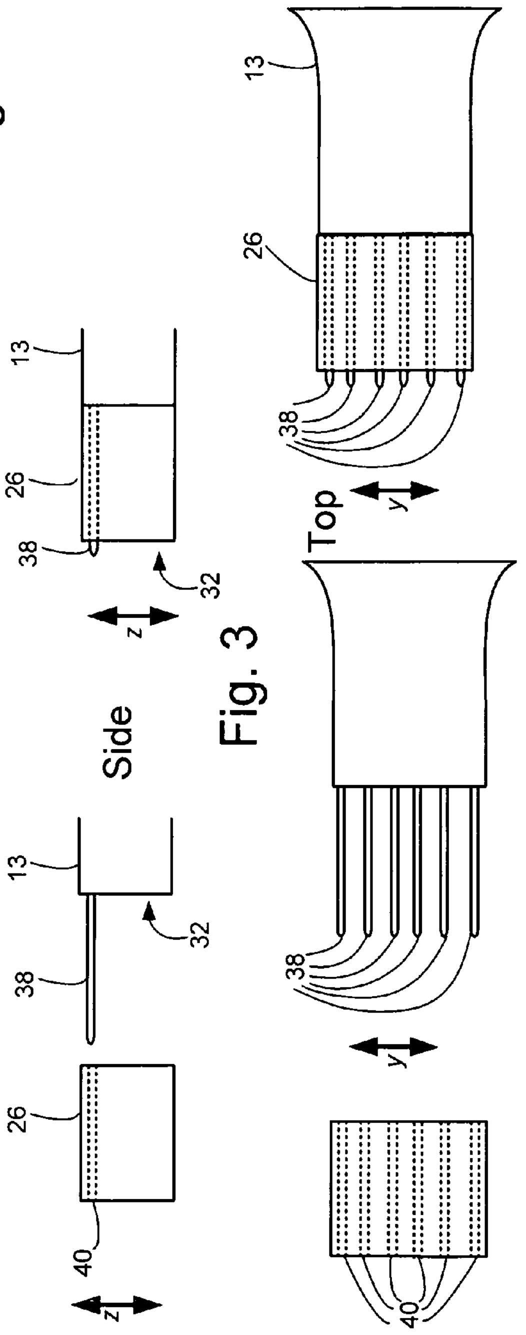
Fig. 3

ACOUSTIC WAVEGUIDE VIBRATION DAMPING

BACKGROUND

This specification describes an acoustic waveguide. Acoustic waveguides are discussed in U.S. Pat. No. 4,628,528.

SUMMARY

In one aspect, an acoustic waveguide includes at least two portions coupled by vibration damping structure. The vibration damping structure may include a conformable material. The conformable material may include foam. The foam may include closed cell foam. The vibration damping structure may be conformably mated to a first portion and mechanically attached to a second portion. The vibration damping structure may be adhesively attached to the second portion. The acoustic waveguide may further include a structure for inhibiting relative motion between a first portion and the vibration damping structure in a direction transverse to an interface between the vibration damping structure and the first portion. The relative motion inhibiting structure may include a protrusion of the first portion for mating with an opening in the vibration damping structure.

In another aspect, an acoustic system includes a chassis; an acoustic waveguide including a first portion; a second portion rigidly attached to the acoustic assembly chassis; and a third portion coupling the first portion and the second portion in a manner that damps the transmission of vibration from the first portion to the chassis. The acoustic system may further include a vibration damping connector for connecting the waveguide second portion to a base plate. The waveguide third portion may include a conformable material. The conformable material may include foam. The foam may include closed cell foam. The waveguide third portion may be conformably mated to the first portion and mechanically attached to the second portion. The waveguide third portion may be adhesively attached to the second portion. The waveguide may further include a structure for inhibiting relative motion between the first portion and the third portion in a direction transverse to an interface between the third portion and the first portion. The relative motion inhibiting structure may include a protrusion of the first portion for mating with an opening in the third portion.

Other features, objects, and advantages will become apparent from the following detailed description, when read in connection with the following drawing, in which:

BRIEF DESCRIPTION OF THE SEVERAL VIEWS OF THE DRAWING

FIGS. 2A-2D are diagrammatic views of a portion of the acoustic waveguide assembly of FIG. 1;

FIG. 3 is a diagrammatic view of a portion of the acoustic waveguide assembly of FIG. 2;

DETAILED DESCRIPTION

Acoustic waveguides are frequently used to radiate low frequency acoustic energy at high amplitudes. The radiation of acoustic energy results in mechanical vibration of the waveguide. Mechanical vibration can result in annoying buzzes and rattles. Additionally, if the acoustic waveguide is mechanically or acoustically coupled to a vibration sensitive component such as an LCD television panel, the operation of the component may be adversely affected. It is desirable to damp the vibration of the waveguide to prevent adverse effect on vibration sensitive components and to prevent buzzing and rattling. Typically, vibration damping permits some relative movement between the waveguide and the device chassis.

The exit of an acoustic waveguide is typically through an opening in the cabinet enclosing the waveguide. If the cabinet is heavy (for example if the device is a large screen television), a user might employ the opening as a handling point. However, if a user uses the opening as a handling point, and if the device includes vibration damping structure, relative movement between the waveguide and the cabinet could pinch the user. Additionally, the use of the waveguide exit as a handing point could cause stress which could result in damage to the waveguide.

Figure 1:
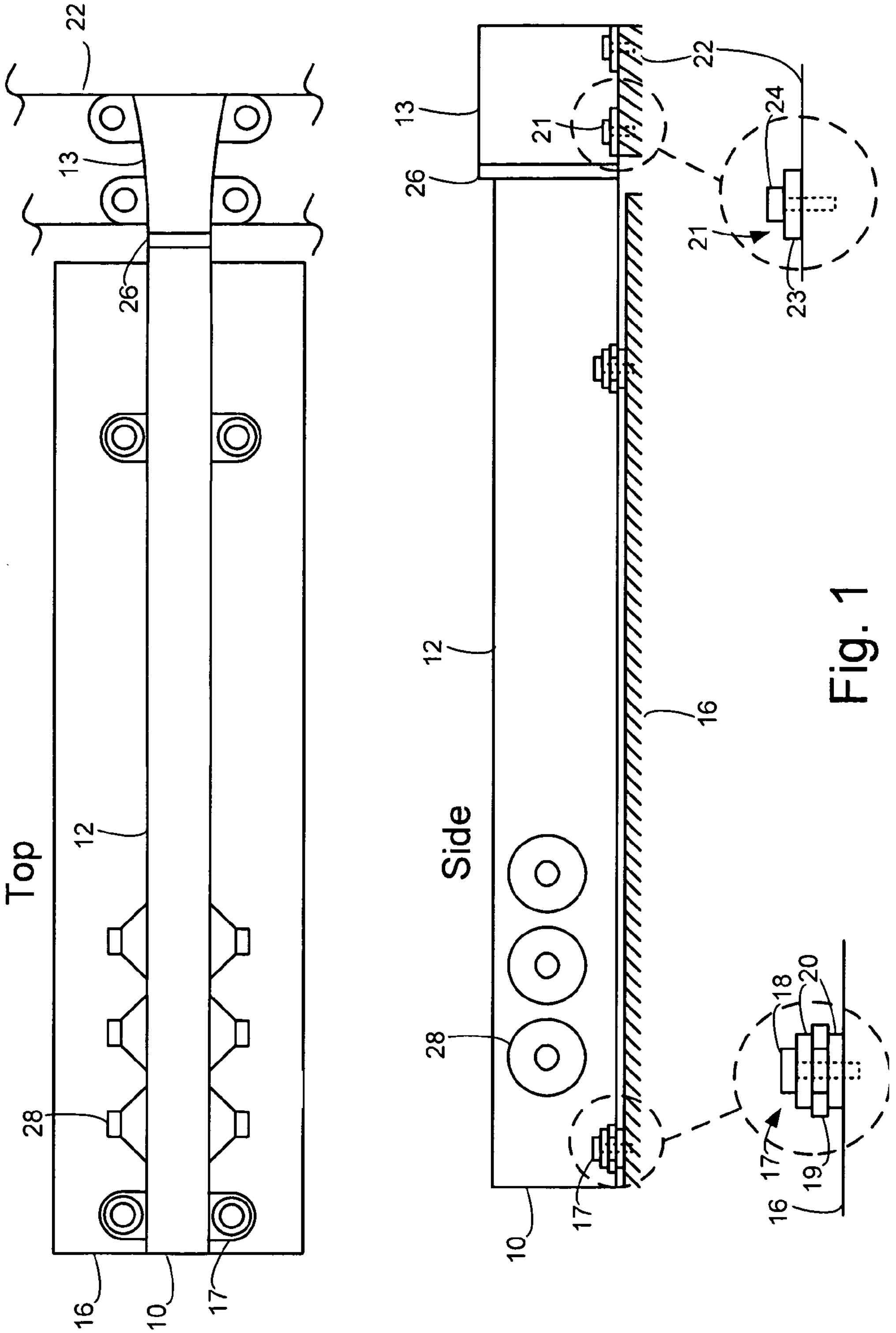
FIG. 1 is a diagrammatic top and side plan view of an acoustic waveguide assembly.

FIG. 1 shows a top view and a side view of a diagrammatic representation of a portion, including a waveguide assembly 10, of an acoustic or multimedia system such as an audio system, a television, a gaming system, or the like. FIG. 1 shows the mechanical relationship of the elements and is not drawn to scale. A first portion 12 of the waveguide assembly 10 is coupled to a mounting element 16 by one or more non-rigid vibration damping connectors 17, each including a fastener 18 and a grommet 20 of forty to fifty durometer viscoelasticity. The fastener 18 extends through an opening in a flange 19 of the acoustic waveguide and is attached to the mounting element 16 to couple the acoustic waveguide assembly 10 to the mounting element 16. The fastener 18 is separated from the flange 19 by grommet 20 which damps vibration from the flange 19 to the mounting element 16.

A second portion 13 of the acoustic waveguide 10 is coupled to a device chassis portion, such as the external shell 22 of the cabinet enclosing the waveguide assembly 10. The coupling is implemented by one or more rigid connectors 21, such as fastener 24 which extends through an opening in flange 23 in the second portion 13 to external shell 22. The first portion 12 of the acoustic waveguide and the second portion 13 of the acoustic waveguide are acoustically coupled by a mating portion 26 in such a manner that the acoustic waveguide acts in a conventional manner acoustically while isolating mechanical vibration of the first portion 12 of the waveguide from the device chassis. The mounting element 16 and the external shell 22 are mechanically coupled by structure not germane to this discussion and are represented in the side view as mechanical grounds. Other types of damping connectors include compliant pucks molded around two separate threaded studs, flexible hinges, piston in cylinder shock absorbers, and others.

The waveguide may also include conventional elements such as one or more acoustic drivers 28. The waveguide shown is close-ended. If the waveguide is open-ended, there may be another mating portion similar to the mating portion 26 coupling the first portion 12 and a second exit portion.

FIGS. 2A-2D show other features of one embodiment of mating portion 26. The mating portion 26 may be constructed of a deformable material, such as an open-celled polyether/polyurethane foam. Other suitable materials include silicones, rubbers, solid deformable plastics, soft polyester closed cell foam, low density expanded foams, or stretchable and/or deformable membranes. In one embodiment, a mating surface 32 of second portion 13 is adhesively attached to a mating surface of mating portion 26. A mating surface 34 of first portion 12 is adhesively attached to a mating surface of mating portion 26. The mating portion 26 is held in place relative to waveguide first portion 12 by mechanical pressure which causes mating portion 26 to deform to seal air leaks.

The mating portion can also adjust for dimensional or assembly intolerances. For example, FIG. 2A shows a normal intersection of first waveguide portion 12, second portion 13, and mating portion 26, with the first and second portions separated by distance d. In FIG. 2B, dimensional or assembly tolerances or both cause the first and second portions to be separated by distance d1 greater than d. The mating portion 26 adjusts for the tolerances by deforming less, but sealing the interface sufficiently to prevent air leaks. In FIG. 2C, dimensional or assembly tolerances or both cause the first and second portions to be separated by distance d2, less than d. The mating portion 26 adjusts for the tolerances by deforming more. In FIG. 2D, dimensional or assembly intolerances or both cause the first portion to be displaced by distance x from the intended position. The mating portion 26 adjusts for the tolerances by deforming at a different area of the mating surface. The deforming of the mating portion 26 may cause the mating portion to protrude into the waveguide resulting in an airflow obstruction, as indicated by arrow 36. Obstructions, especially near the exit of the waveguide, are undesirable because the combination of high velocities near the exit and the obstruction may result in turbulence and therefore audible acoustic noise. Empirical tests, however, indicate that the turbulence resulting from the deformation of mating portion 26 is insignificant.

FIG. 3 shows another feature of an embodiment of mating portion 26 and one or both of portions 12 and 13. Over time, the mating portion 26 may tend to "creep" in directions y and z, transverse to the interface between the mating portion 26 and the waveguide second portion 13. In the embodiment of FIG. 3, fingers 38 extend from second portion 13 into openings 40 in the mating portion 26 to oppose movement in the y and z directions.

Figure 4:
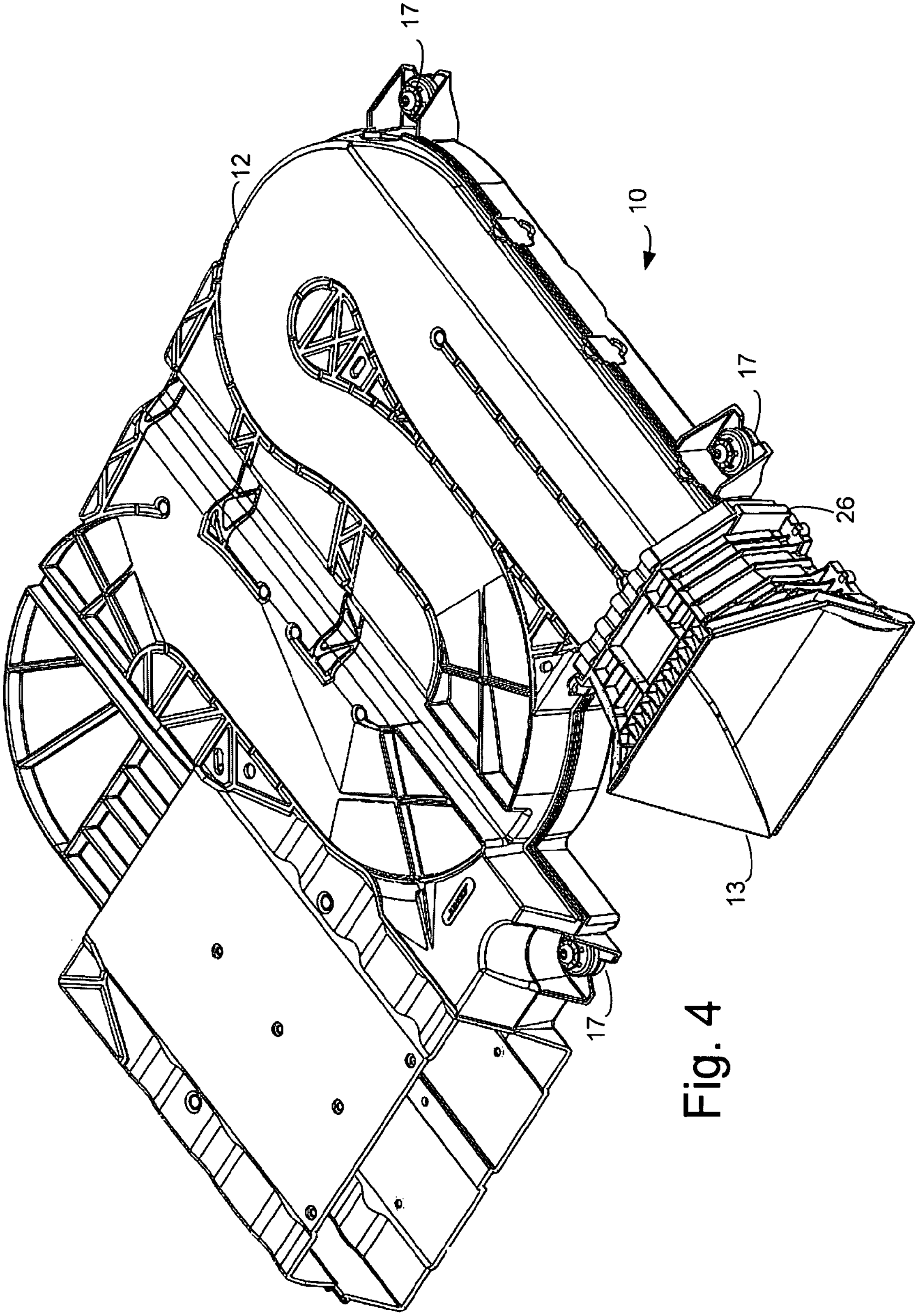
FIG. 4 is an assembled view of an actual implementation of the acoustic waveguide assembly of FIG. 1.
Figure 5:
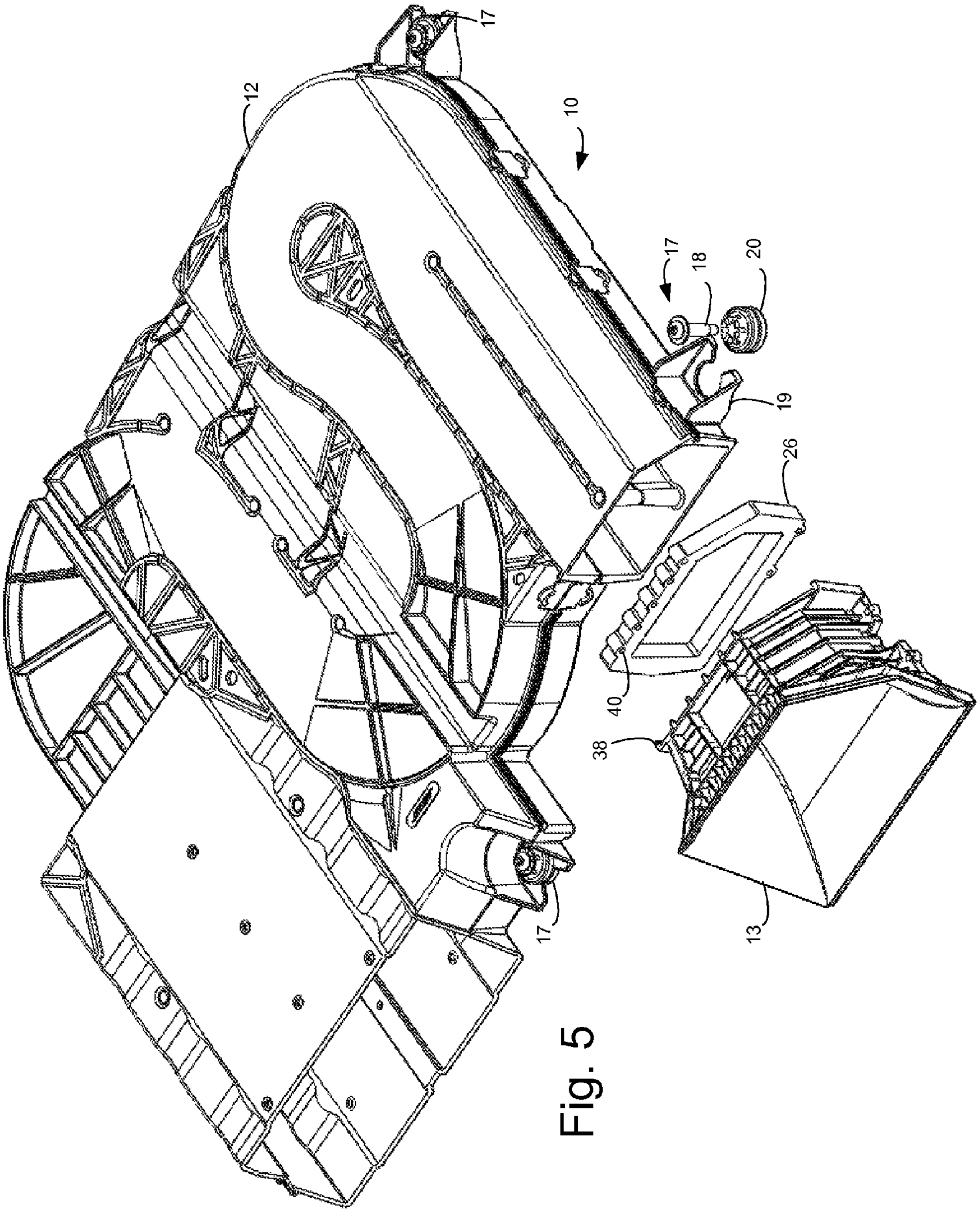
FIG. 5 is an exploded view of an actual implementation of the acoustic waveguide assembly of FIG. 1.

FIGS. 4 and 5 are an assembled view and a partially exploded view, respectively, of an actual implementation of the waveguide assembly 10. Reference numbers in FIGS. 4 and 5 correspond to like numbered elements in the previous views. Some elements, such as acoustic drivers 28 and rigid fasteners 21 are not shown in FIGS. 4 and 5. The waveguide of the embodiments of FIGS. 4 and 5 is of the type described in U.S. patent application Ser. No. 12/020,978, incorporated by reference in its entirety.

Other methods of providing vibrational isolation of the waveguide while permitting rigid mechanical connection to a device chassis include non-intrusive flexible bands or tapes connected to the mating sections by pressure, adhesives, mechanical fasteners, or the like.

A number of embodiments of the invention have been described. Modification may be made without departing from the spirit and scope of the invention, and accordingly, other embodiments are in the claims.

What is claimed is:

1. An acoustic waveguide for radiating acoustic energy comprising:

at least two portions coupled by vibration damping structure in a manner that isolates mechanical vibration of one of the portions from another of the portions and in a manner that permits the transmission of acoustic energy from the one of the portions to the environment through the another of the portions without damping transmission of acoustic energy from the one portion to the another portion;

an acoustic driver to radiate the acoustic energy into the acoustic waveguide; and a structure for inhibiting relative motion between one portion and the vibration damping structure in a direction transverse to an interface between the vibration damping structure and the one portion, wherein the relative motion inhibiting structure comprises a protrusion of the one portion for mating with an opening in the vibration damping structure.

2. An acoustic system comprising:

a chassis;

an acoustic waveguide including a first portion;

a second portion rigidly attached to the acoustic assembly chassis;

a third portion mechanically coupling the first portion and the second portion in a manner that damps the transmission of mechanical vibration from the first portion to the chassis and in a manner that permits the transmission of acoustic energy from the first portion to the environment through the second portion without damping the transmission of acoustic energy from the first portion to the second portion the waveguide; and a structure for inhibiting relative motion between the third portion and another portion in a direction transverse to an interface between the third portion and the another portion, wherein the relative motion inhibiting structure comprises a protrusion of the another portion for mating with an opening in the third portion.

* * * * *